(12) United States Patent
Carpentier et al.

(10) Patent No.: US 10,012,792 B2
(45) Date of Patent: Jul. 3, 2018

(54) THREE-DIMENSIONAL INTEGRATED PHOTONIC STRUCTURE WITH IMPROVED OPTICAL PROPERTIES

(71) Applicant: STMICROELECTRONICS (CROLLES 2) SAS, Crolles (FR)

(72) Inventors: Jean-Francois Carpentier, Grenoble (FR); Patrick Lemaitre, Biviers (FR); Mickael Fourel, Grenoble (FR)

(73) Assignee: STMICROELECTRONICS (CROLLES 2) SAS, Crolles (FR)

( * ) Notice: Subject to any disclaimer, the term of this patent is extended or adjusted under 35 U.S.C. 154(b) by 0 days.

(21) Appl. No.: 15/217,100

(22) Filed: Jul. 22, 2016

(65) Prior Publication Data

US 2017/0199329 A1   Jul. 13, 2017

(30) Foreign Application Priority Data

Jan. 8, 2016 (FR) ..................................... 16 50152

(51) Int. Cl.
| | |
|---|---|
| *G02B 6/42* | (2006.01) |
| *G02B 6/12* | (2006.01) |
| *G02B 6/30* | (2006.01) |
| *H01L 23/13* | (2006.01) |
| *H01L 23/498* | (2006.01) |

(52) U.S. Cl.
CPC ..... *G02B 6/12002* (2013.01); *G02B 6/12004* (2013.01); *G02B 6/30* (2013.01); *G02B 6/428* (2013.01); *G02B 6/4232* (2013.01); *G02B 6/4292* (2013.01); *G02B 6/4269* (2013.01); *H01L 23/13* (2013.01); *H01L 23/49827* (2013.01); *H01L 2224/16225* (2013.01)

(58) Field of Classification Search
None
See application file for complete search history.

(56) References Cited

U.S. PATENT DOCUMENTS

| | | | | |
|---|---|---|---|---|
| 7,433,554 | B2 * | 10/2008 | Warashina | G02B 6/43 385/132 |
| 7,539,366 | B1 * | 5/2009 | Baks | G02B 6/4201 385/14 |
| 7,702,191 | B1 * | 4/2010 | Geron | G02B 6/4249 385/14 |
| 2005/0041935 | A1 * | 2/2005 | Liu | H01L 24/97 385/92 |

(Continued)

FOREIGN PATENT DOCUMENTS

| | | |
|---|---|---|
| WO | 2013095544 A1 | 6/2013 |
| WO | 2013100995 A1 | 7/2013 |

*Primary Examiner* — Mike Stahl
(74) *Attorney, Agent, or Firm* — Slater Matsil, LLP

(57) ABSTRACT

An integrated electronic device includes a substrate having an opening extending therethrough. The substrate includes an interconnection network, and connections coupled to the interconnection network. The connections are to be fixed on a printed circuit board. An integrated photonic module is electrically connected to the substrate, with a portion of the integrated photonic module in front of or overlapping the opening of the substrate. An integrated electronic module is electrically connected to the photonic module, and extends at least partly into the opening of the substrate. The electronic module and the substrate may be electrically connected onto the same face of the photonic module.

28 Claims, 2 Drawing Sheets

(56) References Cited

U.S. PATENT DOCUMENTS

| | | | |
|---|---|---|---|
| 2009/0323748 A1* | 12/2009 | Nobuhara | G02B 6/4232 372/43.01 |
| 2010/0006784 A1 | 1/2010 | Mack et al. | |
| 2010/0215314 A1* | 8/2010 | Lau | G02B 6/43 385/14 |
| 2011/0044367 A1* | 2/2011 | Budd | G02B 6/4201 372/50.21 |
| 2011/0180917 A1 | 7/2011 | Tang | |
| 2011/0210444 A1 | 9/2011 | Jeng et al. | |
| 2012/0128292 A1* | 5/2012 | Hamamura | G02B 6/4201 385/14 |
| 2014/0029639 A1* | 1/2014 | Zarbock | H01L 25/167 372/50.1 |
| 2014/0084441 A1 | 3/2014 | Chiu | |
| 2015/0049498 A1 | 2/2015 | Zhou | |
| 2015/0145086 A1* | 5/2015 | Rokuhara | H01S 5/005 257/432 |
| 2015/0255366 A1 | 9/2015 | Chung | |
| 2016/0085038 A1* | 3/2016 | Decker | G02B 6/4204 385/14 |

* cited by examiner

THREE-DIMENSIONAL INTEGRATED PHOTONIC STRUCTURE WITH IMPROVED OPTICAL PROPERTIES

RELATED APPLICATIONS

This application is a translation of and claims the priority benefit of French patent application number 1650152 filed on Jan. 8, 2016, entitled "Three-Dimensional Integrated Photonic Structure with Improved Optical Properties" which is hereby incorporated by reference to the maximum extent allowable by law.

FIELD OF THE INVENTION

Embodiments of the invention relate to photonic circuits, and more particularly, to the interconnection of photonic modules with other modules, particularly in three-dimensional integrated structures.

BACKGROUND

As illustrated in FIG. 1, a three-dimensional integrated photonic structure STR may conventionally comprise an electronic module 1, an integrated photonic module 2, a component for input/output of an optical signal, and a Ball Grid Array (BGA) substrate 3.

The electronic module 1 includes a plurality of integrated electronic circuits 10 and first solder balls 11 located on one of its faces. The integrated photonic module 2 includes a plurality of integrated photonic circuits produced, for example, in a semiconductor substrate 21, an interconnection part 22, first bonding pads 23 on its upper face, and second solder balls 24 on its lower face.

The component for input/output of an optical signal is not represented. The component may be, for example, a first optical fiber connected to the upper face of the photonic module 2 and optically coupled to the integrated photonic circuits produced in the semiconductor substrate 21.

The BGA substrate 3 includes third solder balls 30 on a first face and second bonding pads 33 on a second face opposite the first face. The substrate also includes metal lines and vias forming an interconnection network 31 making it possible to ensure electrical connection between the second bonding pads 33 and the solder balls 30.

The electronic module 1 may be electrically connected to the photonic module 2 by the first solder balls 11 and the first bonding pads 23. The photonic module 2 may be electrically connected to the BGA substrate 3 by the second solder balls 24 and the second bonding pads 33 located on the upper face of the substrate.

The photonic components of the photonic module are electrically connected to the BGA substrate by through-vias (TSV, Through Silicon Via) extending through the semiconductor substrate 21 of the photonic module, and by the second solder balls 24. The third solder balls 30 may, for example, be intended to be connected onto a printed circuit board.

In this type of three-dimensional integrated photonic structure, the component for input/output of an optical signal is connected to the upper face of the photonic module 2. The electronic module 1 and the integrated photonic module 2 are electrically connected to the BGA substrate 3 by through-vias 20 extending through the semiconductor substrate 21 of the photonic module 2. These through-vias 20 may generate mechanical stresses in the semiconductor substrate 21, which may then modify the refractive index of the medium over a certain distance around the vias.

For critical optical components, such as ring resonators, for example, the use of TSVs entails either specifying safety margins between a TSV and a critical optical component, which complicates the design of the circuits, or using TSVs with a small diameter, which complicates the fabrication of the circuits.

SUMMARY

A three-dimensional structure including a photonic module, which does not comprise any TSVs, is provided.

An integrated device, or structure, comprises a substrate having an opening or hole extending therethrough and includes an interconnection network and connections coupled to the interconnection network. The connections may be fixed on a printed circuit board, for example. An integrated photonic module may be electrically connected to the substrate, having a part in front of a part of the hole of the substrate, and an integrated electronic module electrically connected to the photonic module and extending at least partly into the hole. The electronic module and the substrate may be electrically connected onto a same face or side of the photonic module.

By connecting the electronic module and the substrate onto the same face of the photonic module, the production of through-vias is advantageously avoided while maintaining a structure having a small size. This may be possible, in particular, by the presence of a hole in the substrate, in which hole the photonic module can be placed.

According to one embodiment, the connections may be arranged on a first face of the substrate and the photonic module may be connected to the first face of the substrate. The photonic module may further comprise a semiconductor film or layer incorporating photonic components which include at least one first optical coupler, such as a grating coupler, for example. The semiconductor film may be partly in front of the first face, and the at least one optical coupler may be in front of the hole in the substrate.

According to another embodiment, the connections may be arranged on a first face of the substrate. The photonic module may be connected to the face opposite the first face of the substrate. The photonic module may further comprise a semiconductor film incorporating photonic components which include at least one first optical coupler, such as a grating coupler, for example. The semiconductor film may be partly in front of the face opposite the first face. The at least one first optical coupler may be located in front of a side face of the photonic module.

The device may further comprise a second optical coupler located in front of a side face of the photonic module or in front of the hole. Optionally, a heat sink may be in contact with the electronic module. The heat sink may advantageously be placed in front of the hole of the substrate in such a way that, when the connections are fixed onto a printed circuit board, the sink may be in contact with the printed circuit.

BRIEF DESCRIPTION OF THE DRAWINGS

Other advantages and characteristics of the disclosure will become apparent on studying the detailed description of entirely nonlimiting embodiments and the appended drawings, in which.

DETAILED DESCRIPTION

Figure 1:
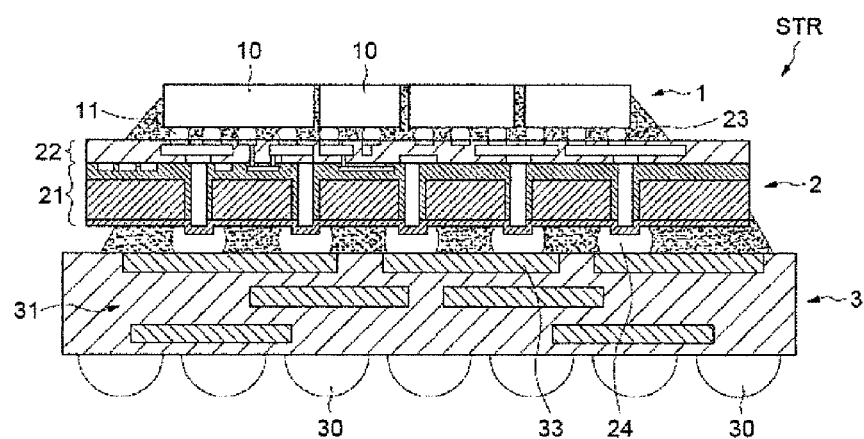
FIG. 1, described above, is a schematic diagram illustrating a three-dimensional integrated photonic structure according to the prior art.
Figure 2:
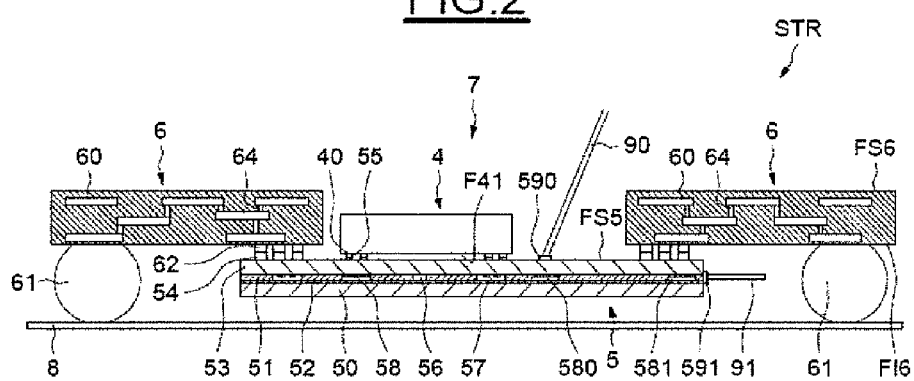
FIGS. 2 to 4 are schematic diagrams illustrating a three-dimensional integrated photonic structure according to the present disclosure.
Figure 3:
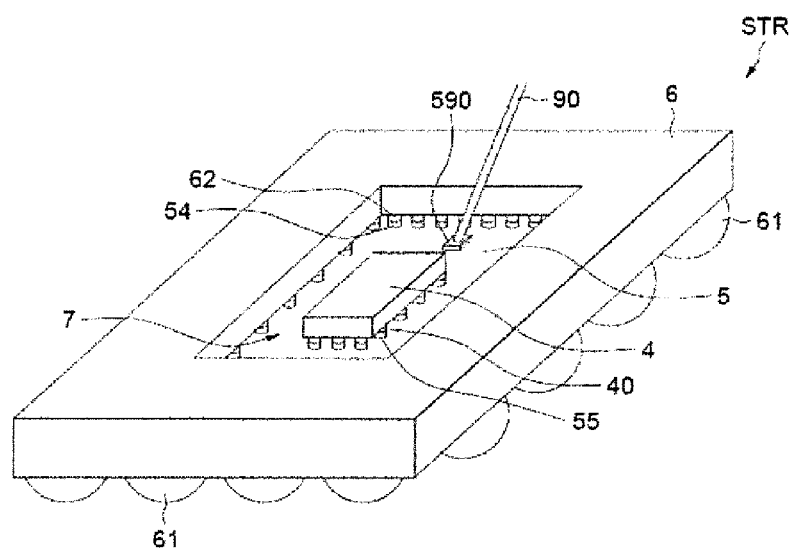

FIGS. 2 and 3 represent a three-dimensional integrated structure STR comprising an electronic module 4 including a plurality of integrated electronic circuits, a photonic module 5 including a plurality of integrated photonic components, and a substrate 6 having a hole or opening 7 extending therethrough. The substrate 6 may be, for example, a Ball Grid Array (BGA) type substrate.

The plurality of integrated electronic circuits may comprise, for example, modulators, analog/digital converters, memory components, and circuits (drivers) for controlling certain photonic components of the photonic module, etc. The electronic module furthermore includes first connections 40 produced on a first face F41, such as first copper pillars, for example.

The illustrated photonic module 5 comprises a substrate of the silicon-on-insulator (SOI), including a carrier substrate 50 and a silicon film 51 arranged above a buried insulating layer 52. The buried insulating layer 52 is commonly referred to as a buried oxide (BOX) layer.

The photonic module 5 furthermore includes an interconnection part 53, known as back end of line (BEOL). This interconnection part includes on its front face FS5 second connections 54, for example, second copper pillars located on the peripheral region of the upper face FS5, and third connections 55, for example, third copper pillars 55 located inside the peripheral region.

The silicon film includes a plurality of photonic components, for example, waveguides 58, modulators 57 and photodetectors 56, as well as optical couplers 580 and 581. The optical couplers 580 and 581 may be, for example, grating couplers, adapted to receive/send an optical signal from/to an input/output component, such as an optical fiber.

Optical connectors 590 and 591 make it possible to connect input/output optical components onto the photonic module 5. These optical connectors 590 and 591 are, for example, secured to the photonic module 5 by adhesive bonding.

The substrate 6 is, for example, a ceramic substrate, which includes an interconnection network comprising metal lines 60 and vias 64 and one face of which, for example the lower face FI6, includes an array of solder balls 61. The solder balls are intended, for example, to be connected onto a printed circuit board 8.

The substrate 6 includes a hole 7, for example, a rectangular through-hole extending from the lower face FI6 of the substrate to an upper face FS6 opposite the lower face FI6. The upper face FS6 furthermore includes fourth connections 62, for example, fourth copper pillars located at the periphery of the hole 7.

The photonic module 5 is secured to the lower face FI6 of the substrate 6 by the second and fourth copper pillars 54 and 62 so that a part of the photonic module 5 is in front of the hole 7. Thus, the silicon film 51 of the photonic module 5 is located partly in front of the lower face FI6 of the substrate 6. The electronic module is secured to the upper face FS5 of the photonic module 5 by the first and third copper pillars 40 and 55 so that it is located partly in the hole 7.

Some of the electronic circuits of the electronic module are therefore electrically connected to the solder balls 61, and therefore to the printed circuit 8, by electrical connections. Each of these electrical connections include first and third copper pillars 40 and 55, vias and metal tracks of the interconnection part 53 of the photonic module, second and fourth copper pillars 54 and 62 located at the periphery of the photonic module 5, and metal tracks 60 and vias 64 of the interconnection network of the substrate 6.

Likewise, first and third copper pillars 40 and 55 as well as vias and metal tracks of the interconnection part 53 of the photonic module ensure the electrical connection between certain electronic circuits of the electronic module, for example control circuits, and certain photonic components of the photonic module, for example modulators 57.

Photonic components may be connected to the solder balls 61 by, in particular, the pillars 54 and 62 and the interconnection network of the substrate 6. In all these cases, the production of through-vias (TSVs) is therefore avoided.

The integrated structure STR in this case furthermore comprises optical input/output components. An input component 90, for example, a first optical fiber, is connected to the upper face FS5 of the photonic module via a first optical connector 590. For example, the optical fiber 90 is thus optically coupled to an optical coupler 580 produced in the semiconductor film 51 and located in front of the hole 7. This optical coupling is possible by virtue of the absence of metal levels in the region of the interconnection part 53 located between the first optical connector 590 and the first optical coupler 580.

It should be noted that the connection of the optical fiber 90 onto the upper face FS5 of the photonic module via the first optical connector 590 is greatly facilitated by the configuration of the photonic module 5 and of the substrate 6. This leaves part of the upper face FS5 of the photonic module, which lies in front of the hole, accessible from outside the structure.

An output component 91, for example, a second optical fiber, is connected onto the edge of the photonic module by a second optical connector 591. For example, the optical fiber 91 is thus optically coupled to a second optical coupler 581 of the substrate 51 located in front of the edge or side face.

Figure 4:
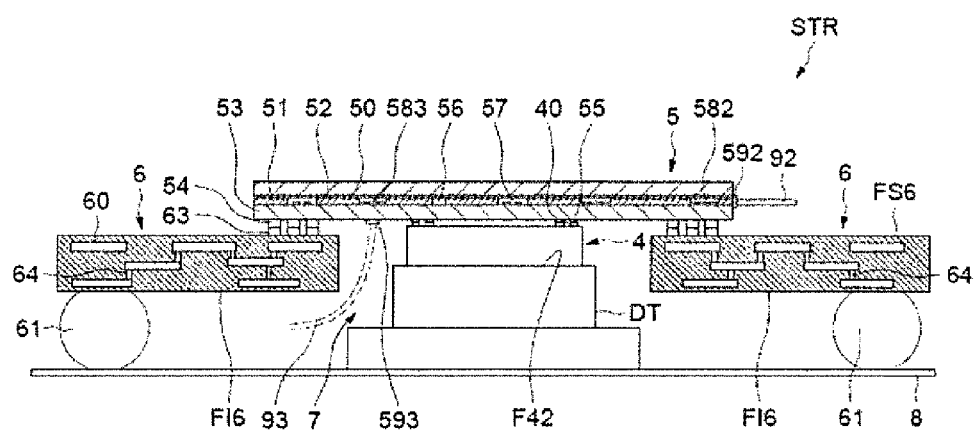

According to another embodiment, which is illustrated in FIG. 4, the second face FS6 of the substrate 6 comprises fifth connections 63, for example, fifth copper pillars located at the periphery of the hole 7. The photonic module 5 is in this case connected to the second face FS6 of the substrate 6 by the second copper pillars 54 and the fifth copper pillars 63, in such a way that a part of the photonic module 5 is located in front of the hole 7.

Thus, the silicon film 51 of the photonic module 5 is located partly in front of the second face FS6 of the substrate 6. The electronic module 4 is connected to the photonic module 5 by the first copper pillars 40 and the third copper pillars 55.

Thus, the electrical connections connecting some of the electronic circuits of the electronic module to the solder balls 60 in this case each include first and third copper pillars 40 and 55, vias and metal tracks of the interconnection part 53 of the photonic module, second and fifth copper pillars 54 and 63, metal tracks 60 and vias 64 of the interconnection network of the substrate 6.

A single input/output component, for example, an optical fiber 92, is connected to a side face of the photonic module 5 by an optical connector 592. For example, the optical fiber 92 is thus optically coupled to an integrated optical coupler 582 produced in the semiconductor film 51 in front of the side face.

A heat sink DT is, in this case, connected onto a second face F42 of the electronic module. Thus, the electronic module 4 and the heat sink DT are located partly in the hole 7. The heat sink DT is in this case also in contact with the printed circuit board 8.

It is also possible to envisage the photonic module furthermore including at least one photonic component, such as the grating coupler 583 arranged in front of the hole 7 of the substrate 6, adapted to be coupled optically to an input/output component, such as the optical fiber 93 represented by broken lines, via an optical connector 593.

In this case, it is necessary to make provisions to use compact input/output components adapted to be accommodated in the height defined between the interconnection part 53 of the photonic module and the printed circuit board 8. To this end, it is possible to use optical fibers capable of having small radii of curvature, for example, on the order of one millimeter. It could, of course, be envisaged to have only a single input/output optical fiber 93 optically coupled to the coupler 583. This type of arrangement makes it possible to avoid resorting to an optical connection via the edge of the photonic module.

Although photonic modules associated with optical connectors adapted to receive input/output components such as the optical fibers 90, 91, 92 and 93 have been described here, it is entirely possible to envisage a photonic module which is at least without an input optical connector, and therefore an input optical fiber, but in which the photonic module 5 comprises an integrated light source, for example a hybrid laser source.

That which is claimed is:

1. An integrated device comprising:
   a substrate having an opening extending therethrough and comprising an interconnection network, and a plurality of connections coupled to said interconnection network;
   an integrated photonic module electrically coupled to said substrate, with a portion of said integrated photonic module overlapping the opening of said substrate;
   an integrated electronic module electrically coupled to said integrated photonic module and extending at least partly into the opening of said substrate, wherein said integrated electronic module and said substrate are electrically coupled to a same side of said integrated photonic module; and
   a heat sink coupled to said integrated electronic module, wherein said heat sink is configured so that when said substrate is coupled to a printed circuit board via said plurality of connections, said heat sink is also in contact with the printed circuit board.

2. The integrated device according to claim 1, wherein said plurality of connections is arranged on a first side of said substrate; and wherein said integrated photonic module is coupled to a second side of said substrate opposite the first side.

3. The integrated device according to claim 2, wherein said integrated photonic module comprises:
   a semiconductor layer adjacent the second side of said substrate and overlapping the opening of said substrate, and
   a plurality of photonic components incorporated within said semiconductor layer, wherein said plurality of photonic components comprises at least one first optical coupler non-overlapping the opening of said substrate.

4. The integrated device according to claim 3, wherein said plurality of photonic components further comprises a second optical coupler non-overlapping the opening of said substrate.

5. The integrated device according to claim 3, wherein said plurality of photonic components further comprises a second optical coupler overlapping the opening of said substrate.

6. A method for making an integrated device comprising:
   providing a substrate having an opening extending therethrough, with the substrate comprising an interconnection network and a plurality of connections coupled to the interconnection network;
   coupling a photonic module to the substrate, with a portion of the photonic module overlapping the opening of the substrate;
   coupling an electronic module to the photonic module, with the electronic module extending at least partly into the opening of the substrate, wherein the electronic module and the substrate are coupled to a same side of the photonic module; and
   coupling a heat sink to the electronic module, wherein the heat sink is configured so that when the substrate is coupled to a printed circuit board via the plurality of connections, the heat sink is also in contact with the printed circuit board.

7. The method according to claim 6, wherein the plurality of connections are arranged on a first side of the substrate, and wherein the photonic module is coupled to a second side of the substrate opposite the first side.

8. The method according to claim 7, wherein the photonic module comprises a semiconductor layer adjacent the second side of the substrate and overlapping the opening of the substrate, and a plurality of photonic components incorporated within the semiconductor layer, with the plurality of photonic components comprising at least one first optical coupler non-overlapping the opening of the substrate.

9. The method according to claim 8, wherein the plurality of photonic components further comprises a second optical coupler non-overlapping the opening of the substrate.

10. The method according to claim 8, wherein the plurality of photonic components further comprises a second optical coupler overlapping the opening of the substrate.

11. An integrated device comprising:
    a substrate having a first major surface and a second major surface, the substrate comprising a hole extending from the first major surface to the second major surface and an interconnection network;
    a plurality of balls attached to the first major surface and electrically coupled to the interconnection network;
    a photonic chip attached to the first major surface and electrically coupled to the interconnection network, wherein a portion of the photonic chip overlaps with the hole; and
    an integrated circuit chip for controlling the photonic chip disposed in the hole and electrically coupled to the photonic chip,
    wherein the integrated circuit chip and the substrate are attached to a same side of the photonic chip.

12. The integrated device according to claim 11, wherein the photonic chip is attached to the first major surface through a plurality of pillars.

13. The integrated device according to claim 11, wherein the integrated circuit chip is attached to the photonic chip through a plurality of pillars.

14. The integrated device according to claim 11, wherein the photonic chip has a larger footprint than the integrated circuit chip.

15. The integrated device according to claim 11, wherein the photonic chip comprises:
   a semiconductor layer adjacent the first major surface of the substrate and overlapping the hole, and
   a plurality of photonic components disposed within the semiconductor layer, wherein the plurality of photonic components comprise a first optical coupler overlapping the hole.

16. The integrated device according to claim 15, wherein the plurality of photonic components further comprises a second optical coupler not overlapping with the hole.

17. The integrated device according to claim 15, wherein the plurality of photonic components further comprises a second optical coupler overlapping with the hole.

18. The integrated device according to claim 11, further comprising a heat sink coupled to the integrated circuit chip.

19. The integrated device according to claim 11, wherein the substrate is configured to be mounted to a printed circuit board through the plurality of balls.

20. A method for making an integrated device comprising:
   providing a substrate having a first major surface and a second major surface, the substrate comprising a hole extending from the first major surface to the second major surface and an interconnection network;
   forming a plurality of balls attached to the first major surface and electrically coupled to the interconnection network;
   attaching a photonic chip to the first major surface and electrically coupled to the interconnection network, wherein a portion of the photonic chip overlaps with the hole; and
   electrically coupling an integrated circuit chip for controlling the photonic chip to the photonic chip, the integrated circuit chip disposed in the hole, wherein the integrated circuit chip and the substrate are attached to a same side of the photonic chip.

21. The method according to claim 20, wherein attaching a photonic chip to the first major surface comprises attaching the photonic chip to the first major surface through a plurality of pillars.

22. The method according to claim 20, further comprising attaching the integrated circuit chip to the photonic chip through a plurality of pillars.

23. The method according to claim 20, wherein the photonic chip has a larger footprint than the integrated circuit chip.

24. The method according to claim 20, wherein the photonic chip comprises:
   a semiconductor layer adjacent the first major surface of the substrate and overlapping the hole, and
   a plurality of photonic components disposed within the semiconductor layer, wherein the plurality of photonic components comprise a first optical coupler overlapping the hole.

25. The method according to claim 24, wherein the plurality of photonic components further comprises a second optical coupler not overlapping with the hole.

26. The method according to claim 24, wherein the plurality of photonic components further comprises a second optical coupler overlapping with the hole.

27. The method according to claim 20, further comprising coupling a heat sink to the integrated circuit chip.

28. The method according to claim 20, further comprising mounting the substrate to a printed circuit board through the plurality of balls.

* * * * *